US010505644B2

(12) United States Patent
Deriso

(10) Patent No.: US 10,505,644 B2
(45) Date of Patent: *Dec. 10, 2019

(54) APPARATUS AND METHODS FOR TESTING PATCH ANTENNAS

(71) Applicant: Skyworks Solutions, Inc., Woburn, MA (US)

(72) Inventor: John Christopher Deriso, Long Beach Township, NJ (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/436,084

(22) Filed: Jun. 10, 2019

(65) Prior Publication Data

US 2019/0296835 A1    Sep. 26, 2019

Related U.S. Application Data

(63) Continuation of application No. 15/654,211, filed on Jul. 19, 2017, now Pat. No. 10,361,795.

(Continued)

(51) Int. Cl.
*H04B 17/12* (2015.01)
*H04B 17/00* (2015.01)
(Continued)

(52) U.S. Cl.
CPC ......... *H04B 17/12* (2015.01); *G01R 31/2822* (2013.01); *G01R 31/2884* (2013.01); *G06F 11/261* (2013.01); *H01Q 9/045* (2013.01); *H01Q 9/0407* (2013.01); *H04B 17/0085* (2013.01); *H04W 24/06* (2013.01); *G01R 27/2688* (2013.01); *G01R 27/28* (2013.01)

(58) Field of Classification Search
CPC .............. G01R 27/2688; G01R 27/28; G01R 31/2884; G01R 31/2822; H04B 17/0085; G06F 11/261

(Continued)

(56) References Cited

U.S. PATENT DOCUMENTS 6,448,787 B1 *   9/2002   Oglesby ............... G01R 29/10
                                                         324/612
7,135,880 B2 *   11/2006  Negishi ............ G01R 31/31928
                                                        324/750.01

(Continued)

OTHER PUBLICATIONS

Borja, Carmen, and Jordi Romeu. "On the behavior of Koch island fractal boundary microstrip patch antenna." IEEE transactions on Antennas and propagation 51.6 (2003): 1281-1291.

(Continued)

*Primary Examiner* — Christopher P McAndrew
(74) *Attorney, Agent, or Firm* — Knobbe, Martens, Olson & Bear, LLP

(57) ABSTRACT

Apparatus and methods for testing of patch antennas are provided herein. In certain configurations, a method of electronic testing of patch antennas includes moving a patch antenna having a planar antenna element onto a test fixture using an automated handler, including positioning the patch antenna onto a portion of the test fixture between a first probe and a second probe. The method further includes coupling a test signal from the first probe to the planar antenna element without physically contacting the planar antenna element with the first probe, coupling the test signal from the planar antenna element to the second probe without physically contacting the planar antenna element with the second probe, and measuring a center frequency of the patch antenna based on an amount of coupling of the test signal from the first probe to the second probe by way of the planar antenna element.

20 Claims, 8 Drawing Sheets

Related U.S. Application Data

(60) Provisional application No. 62/367,251, filed on Jul. 27, 2016.

(51) Int. Cl.
*G01R 31/28* (2006.01)
*G01R 27/28* (2006.01)
*H01Q 9/04* (2006.01)
*G06F 11/26* (2006.01)
*H04W 24/06* (2009.01)
*G01R 27/26* (2006.01)

(58) Field of Classification Search
USPC .................................................. 324/750.01
See application file for complete search history.

(56) References Cited

U.S. PATENT DOCUMENTS

| | | | |
|---|---|---|---|
| 7,876,276 B1* | 1/2011 | Zaman | H01Q 3/08 343/703 |
| 9,272,381 B2 | 3/2016 | Teng et al. | |
| 10,361,795 B2 | 7/2019 | Deriso | |
| 2005/0146467 A1* | 7/2005 | He | H01Q 9/0407 343/700 MS |
| 2012/0212244 A1* | 8/2012 | Zhao | G01R 31/3025 324/750.01 |
| 2013/0328582 A1* | 12/2013 | Han | H01Q 9/0442 324/750.02 |
| 2014/0368225 A1* | 12/2014 | Hiraga | G01R 31/002 324/750.01 |
| 2015/0180130 A1 | 6/2015 | Yang | |

OTHER PUBLICATIONS

Manesh, Ellie, "Passive Patch Antenna—Application Note," Abracon Corporation, 8 pages.
Nilavalan, R., et al. "Wideband microstrip patch antenna design for breast cancer tumour detection." IET Microwaves, Antennas & Propagation 1.2 (2007): 277-281.
Sanders, Jeremiah W., Jun Yao, and Haiying Huang. "Microstrip patch antenna temperature sensor." IEEE Sensors Journal 15.9 (2015): 5312-5319.

* cited by examiner

APPARATUS AND METHODS FOR TESTING PATCH ANTENNAS

CROSS-REFERENCE TO RELATED APPLICATIONS

This application is a continuation of U.S. application Ser. No. 15/654,211, filed Jul. 19, 2017 and titled "APPARATUS AND METHODS FOR TESTING PATCH ANTENNAS," which claims the benefit of priority under 35 U.S.C. § 119(e) of U.S. Provisional Patent Application No. 62/367,251, filed Jul. 27, 2016 and titled "APPARATUS AND METHODS FOR TESTING PATCH ANTENNAS," which is herein incorporated by reference in its entirety.

BACKGROUND

Field

Embodiments of the invention relate to electronic testing and, in particular, to methodologies and devices for testing patch antennas.

Description of Related Technology

Patch antennas can be used to transmit or receive signals of a wide range of frequencies. For example, a patch antenna can used for communication of RF signals, for instance, in a frequency range of about 450 MHz to about 90 GHz for certain communications standards.

SUMMARY

In certain embodiments, the present disclosure relates to a method of electronic testing of patch antennas. The method includes positioning a patch antenna onto a test fixture, coupling a test signal from a first probe to the patch antenna, and coupling the test signal from the patch antenna to a second probe. The first probe includes a first central conductor extending through a first opening of the test fixture, the second probe includes a second central conductor extending through a second opening of the test fixture. The method further includes measuring one or more electrical parameters of the patch antenna based on an amount of coupling of the test signal from the first probe to the second probe via the patch antenna.

In some embodiments, the method further includes providing the test signal to the first probe using a signal analyzer, and analyzing a response of the patch antenna to the test signal via the second probe using the signal analyzer.

In various embodiments, measuring one or more electrical parameters of the patch antenna includes measuring a quality factor of the patch antenna.

In a number of embodiments, measuring one or more electrical parameters of the patch antenna includes measuring a bandwidth of the patch antenna.

In accordance with certain embodiments, measuring one or more electrical parameters of the patch antenna includes measuring a center frequency of the patch antenna.

In some embodiments, positioning the patch antenna onto the test fixture includes moving the patch antenna using an automated handler.

In several embodiments, positioning the patch antenna onto the test fixture includes positioning the patch antenna such that the first probe in a first recess along a first edge of the patch antenna and such that the second probe is in a second recess along a second edge of the patch antenna.

In a number of embodiments, the test signal is coupled from the first probe to the patch antenna without any physical contact between the first probe and a planar antenna element of the patch antenna.

In various embodiments, the test signal is coupled from the patch antenna to the second probe without any physical contact between the second probe and a planar antenna element of the patch antenna.

In several embodiments, coupling the test signal from the first probe to the patch antenna includes generating an electric field using a transmission line probe.

In accordance with a number of embodiments, coupling the test signal from the patch antenna to the second probe includes sensing a vertical electric field emanating from an edge of the patch antenna.

In a number of embodiments, the method further includes attaching the patch antenna to the test fixture using an adhesive.

In various embodiments, the method further includes securing the patch antenna to the test fixture using one or more non-conductive fasteners.

According to several embodiments, positioning the patch antenna onto the test fixture includes positioning an edge of the patch antenna alongside a non-conductive mechanical stop.

In various embodiments, the method further includes at least one of measuring or controlling temperature using a temperature unit.

In some embodiments, measuring one or more electrical parameters of the patch antenna includes performing measurements at two or more different temperatures.

In certain embodiments, the present disclosure relates to a test fixture for testing patch antennas. The test fixture includes a conductive plate implemented to receive a patch antenna and to control a voltage of a backside conductor of the patch antenna, a first opening in the conductive plate, the first opening implemented to receive a first central conductor of a first probe, the first opening orientated such that the first central conductor is spaced apart from a first edge of the patch antenna, and a second opening in the conductive plate, the second opening implemented to receive a second central conductor of a second probe, the second opening orientated such that the second central conductor is spaced apart from a second edge of the patch antenna.

In certain embodiments, the present disclosure relates to an electronic testing system for testing patch antennas. The electronic testing system includes a test fixture implemented to receive a patch antenna, the test fixture including a first opening and a second opening, a first probe including a first central conductor extending through the first opening of the test fixture, a second probe including a second central conductor extending through the second opening of the test fixture, and a signal analyzer electrically connected to the first probe and to the second probe. The signal analyzer is configured to generate a test signal on the first probe, and to determine an amount of coupling of the test signal from the first probe to the second probe via the patch antenna.

In several embodiments, the electronic testing system further includes an automated handler configured to move the patch antenna onto and off of the test fixture.

In some embodiments, the signal analyzer is configured to control a frequency of the test signal to multiple frequency values to measure a frequency response characteristic of the patch antenna.

In a number of embodiments, the frequency response characteristic includes at least one of a quality factor, a center frequency, or a bandwidth of the patch antenna.

In some embodiments, the electronic testing system further includes a controller for synchronizing the operation of the signal analyzer and the handler.

In several embodiments, the electronic testing system further includes a temperature unit configured to provide at least one of temperature control or temperate monitoring.

In various embodiments, the electronic testing system further includes a mechanical stop attached to the test fixture and configured to secure an edge of the patch antenna.

In some embodiments, the test fixture includes a conductive plate configured to electrically connect to a backside conductor of the patch antenna.

In certain embodiments, the present disclosure relates a method of manufacturing patch antennas. The method includes making a first patch antenna including a planar antenna element using a batch of dielectric and a first antenna pattern. The method further includes measuring one or more electrical parameters of the first patch antenna based on coupling a test signal from a first probe to the planar antenna element, coupling the test signal from the planar antenna element to a second probe, and determining an amount of coupling of the test signal from the first probe to the second probe via the planar antenna element. The method further includes selecting a second antenna pattern from a plurality of available antenna patterns based on the measurements. The method further includes making a second patch antenna using the batch of dielectric and the second antenna pattern.

In some embodiments, the one or more electrical parameters are measured without any physical contact between the planar antenna element and the first and second probes.

DETAILED DESCRIPTION OF CERTAIN EMBODIMENTS

Figure 1A:
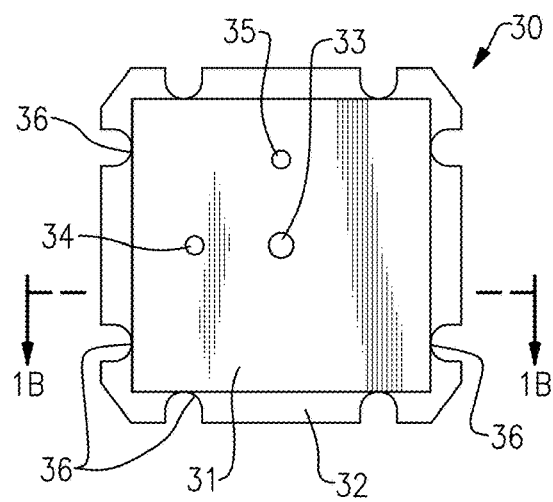
FIG. 1A is a schematic diagram of a plan view of one example of a patch antenna.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A patch antenna, which can also be referred to as a microstrip antenna, can be used in a wide variety of applications. In one example, one or more patch antennas are mounted to an exterior of an aircraft or other vehicle, and are used to transmit or receive radio frequency signals, such as global positioning system (GPS) signals. In another example, one or more patch antennas are incorporated into a radio frequency (RF) communications device, such as a mobile phone, tablet, base station, network access point, customer-premises equipment (CPE), or laptop.

A patch antenna can include a planar antenna element positioned over a ground plane. In certain configurations, the patch antenna is implemented using a printed circuit board (PCB), with the planar antenna element formed using a patterned conductive layer on a first side of a dielectric substrate and the ground plane formed using a conductive layer on a second or opposing side of the dielectric substrate. A patch antenna can have a relatively thin profile and exhibit robust mechanical strength.

The electrical performance of a patch antenna can vary with a wide range of factors, including, but not limited to, design implementation, operating environment, and/or manufacturing variation. Accordingly it is desirable to test a patch antenna for conformance with electrical specifications prior to use by an end-user.

However, a patch antenna can be difficult to test. For example, the center frequency, quality factor, and/or temperature coefficient can be difficult to measure with precision. Moreover, difficulties in measuring a patch antenna can be exacerbated by a patch antenna's inherent broadband frequency response when connected to other circuitry for transmission or reception.

In one example, patch antenna testing can be performed using a direct wired connection made to the patch antenna. However, a direct wired connection may not be feasible for rapid automated testing, and thus testing a patch antenna in this manner may increase testing costs and/or limit manufacturing throughput. Moreover, a direct wired connection may degrade testing accuracy and/or may cause damage to the patch antenna.

Provided herein are various methods and devices for patch antenna testing. In certain configurations, a method of electronic testing of patch antennas is provided. The method includes positioning a patch antenna onto a test fixture, coupling a test signal from a first probe to the patch antenna, coupling the test signal from the patch antenna to a second probe, and measuring one or more electrical parameters of the patch antenna based on an amount of coupling of the test signal from the first probe to the second probe via the patch antenna.

Thus, patch antennas can be measured via a non-destructive process, in which no direct electrical connection to the patch antenna's planar antenna element is needed. The method can be used to provide rapid quality assurance checking of patch antennas, which can be in a final deliverable form.

The testing of patch antennas can be fully automated. For example, an automated handler can be used to move patch antennas onto and off of the test fixture. Additionally, a signal analyzer can be used to provide a test signal to the first probe, and to analyze the amount of coupling of the test signal to the second probe by way of the patch antenna.

In certain configurations, an electronic testing system for testing patch antennas is provided. The electronic testing system includes a test fixture implemented to receive a patch antenna, a first probe including a first central conductor extending through a first opening of the test fixture, a second probe including a second central conductor extending through a second opening of the test fixture, and a signal analyzer electrically connected to the first probe and to the second probe. The signal analyzer generates a test signal on the first probe, and determines an amount of coupling of the test signal from the first probe to the second probe via the patch antenna.

Figure 1B:
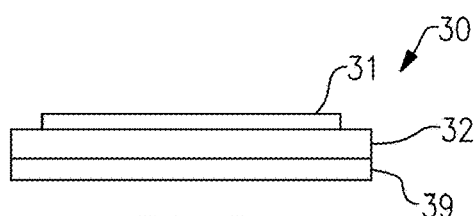
FIG. 1B is a schematic diagram of a cross-section of the patch antenna of FIG. 1A taken along the lines 1B-1B.

FIG. 1A is a schematic diagram of a plan view of one example of a patch antenna 30. FIG. 1B is a schematic diagram of a cross-section of the patch antenna 30 of FIG. 1A taken along the lines 1B-1B.

The illustrated patch antenna 30 includes a planar antenna element 31, a dielectric substrate 32, and a ground plane 39. As shown in FIG. 1B, the planar antenna element 30 is formed from a conductive layer on a first side of the dielectric substrate 32, and the ground plane 39 is formed from a conductive layer on a second or opposing side of the dielectric substrate 32.

In certain implementations, the patch antenna 30 is implemented using a PCB. In one example, the planar antenna element 31 and the ground plane 39 includes a metal, such as copper, and the dielectric substrate 32 includes a prepreg, such as FR-4 board. However, other implementations are possible. For instance, in another example, the dielectric substrate 32 includes ceramic and/or plastic.

The illustrated patch antenna 30 includes a fastener opening 33, which can be used to secure the patch antenna 30 to another structure. For example, a fastener, such as a screw or bolt, can pass through the patch antenna 30 via the fastener opening 33 to mount the patch antenna 30.

With continuing reference to FIGS. 1A-1B, the patch antenna 30 includes a first signal feed 34 and a second signal feed 35. As persons of ordinary skill in the art will appreciate, the first and second signal feeds 34, 35 can be used for transmitting and/or receiving radio frequency signals using the patch antenna 30.

In the illustrated embodiment, the patch antenna 30 includes notches or recesses 36 in the dielectric substrate 32 along the patch antenna's edges. The recesses 36 provide an end-user with a provision for tuning a center frequency of the patch antenna 30.

The patch antenna 30 of FIGS. 1A-1B illustrates one implementation of a patch antenna that can be tested using the apparatus and methods disclosed herein. However, the teachings herein can be used to test patch antennas implemented in a wide variety of ways. For example, a patch antenna can include other numbers of layers, different types of layers, different implementations of signal feeds, different implementations of mounting, and/or can have other shapes (for instance, a non-rectangular planar antenna element and/or a substrate of another shape). Accordingly, other implementations of patch antennas are possible.

Figure 2:
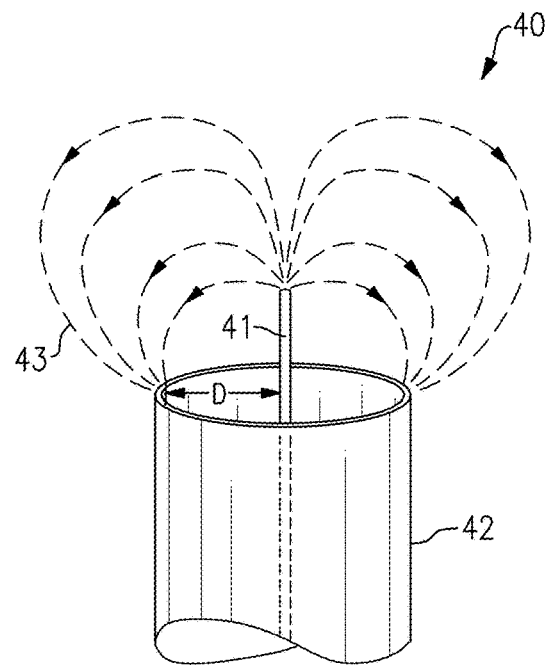
FIG. 2 is a schematic diagram of one example of a probe.

FIG. 2 is a schematic diagram of one example of a probe 40. The probe 40 includes an outer conductor 42 and an inner or central conductor 41. Although omitted from FIG. 2 for clarity, the probe 40 can include other structures, including, but not limited to, dielectric. Furthermore, the inner conductor 41 and/or outer conductor 42 can be shaped in other ways.

As illustrated in FIG. 2, the outer conductor 42 has been implemented as a hollow cylinder that surrounds a portion of the central conductor 41. The central conductor 41 has been implemented to extend along a central axis of the outer conductor 42 and to extend through an open face of the outer conductor 42 to form a conductive tip.

In certain implementations herein, a probe's conductive tip passes through a test fixture, and is positioned alongside an edge of a patch antenna (for instance, the inner conductor 41 can be substantially perpendicular to a patch antenna's planar antenna element). Thus, the central conductor 41 can be used to probe a patch antenna without direct electrical connection to the patch antenna's planar antenna element.

As shown in FIG. 2, the central conductor 41 and the outer conductor 42 are separated by a distance D. The outer conductor 42 can have an electrical potential that is controlled to a suitable voltage, such as ground. In certain implementations, the outer conductor 42 is electrically connected to a conductive test fixture, which in turn is electrically connected to a backside conductor or ground plane of a patch antenna.

As will be described in detail further below, an electronic testing system can include a first probe and a second probe. Additionally, the electronic testing system generates a test signal, which is coupled from the first probe to the patch antenna, and then from the patch antenna to the second probe.

Accordingly, the probe 40 can be used both for coupling a test signal to a patch antenna and for receiving a coupled signal from a patch antenna. For example, to couple the test signal to the patch antenna, the probe 40 is positioned in proximity to the patch antenna, and the voltage of the inner conductor 41 is controlled based on the test signal. Thus, a magnitude of a generated electric field 43 changes in relation to the test signal, and the test signal is coupled to the patch antenna via the electric field 43. To couple a test signal from the patch antenna to the probe 40, the probe is positioned in proximity to the patch antenna, and an electric field emanating from the patch antenna causes a voltage of the central conductor 41 to change in relation to the electrical field.

The probe 40 of FIG. 2 illustrates one implementation of a probe that can be used in accordance with the apparatus and methods for patch antenna testing disclosed herein. However, the teachings herein can be used with probes implemented in a wide variety of ways.

Figure 3:
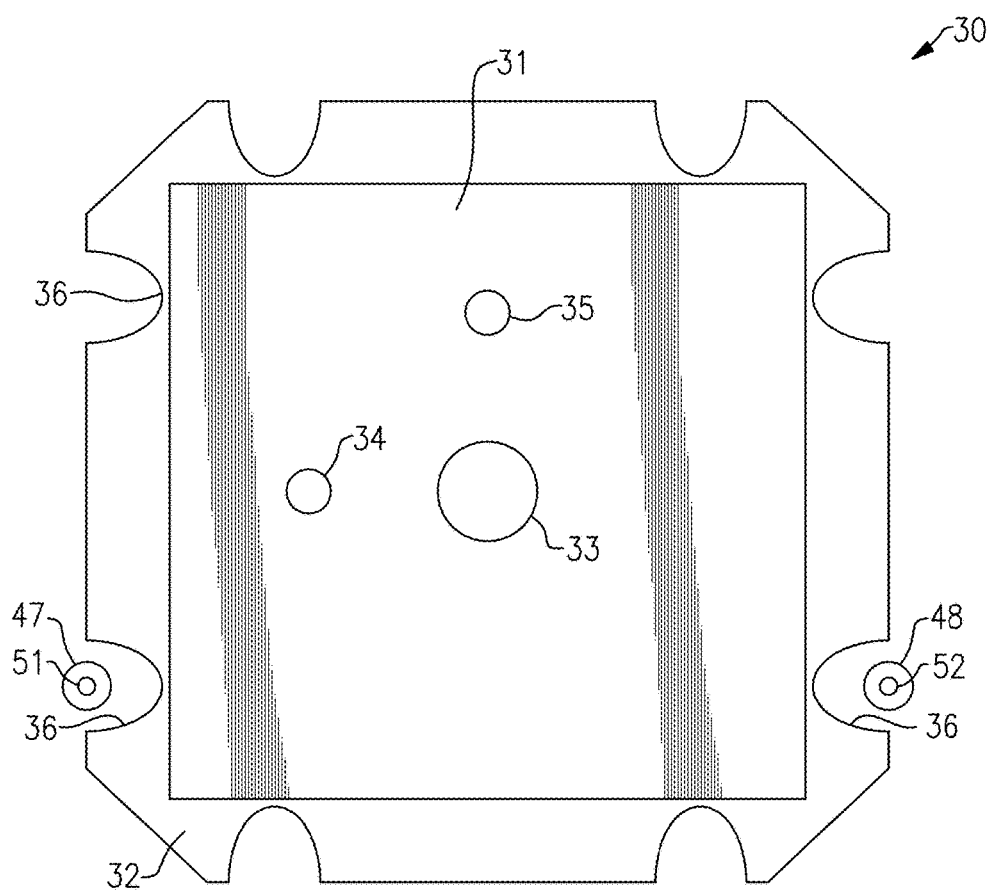
FIG. 3 is a schematic diagram of one embodiment of a patch antenna being tested by probes.

FIG. 3 is a schematic diagram of one embodiment of a patch antenna being tested by probes.

As shown in FIG. 3, a first central conductor 51 of a first probe 47 is positioned adjacent to a first edge of the patch antenna 30. The first central conductor 51 is spaced apart from and substantially perpendicular to the planar antenna element 31. Additionally, a second central conductor 52 of a second probe 48 is positioned adjacent to a second edge of the patch antenna 30. The second central conductor 52 is spaced apart from and substantially perpendicular to the planar antenna element 31.

In the illustrated embodiment, the central conductors 51, 52 are positioned at least partially in recesses 36 of the patch antenna 30. However, other implementations are possible.

To provide testing of the patch antenna 30, a test signal is provided to the first central conductor 51, and is coupled from the first central conductor 51 to the planar antenna element 31 via the electric field emanating from the first central conductor 51. The coupled test signal causes the patch antenna's planar antenna element 31 to generate an electric field, and thus the test signal is thereafter coupled from the planar antenna element 31 to the second central conductor 52 of the second probe 48.

Thus, electrical characteristics of the patch antenna 30 can be measured via a non-destructive process, in which no direct electrical connection is needed to the planar antenna element 31. Rather, electrical parameters of the patch antenna 30 can be determined based on an amount of coupling of the test signal from the first central conductor 51 of the first probe 47 to the second central conductor 52 of the second probe 48 via the patch antenna's planar antenna element 31.

In certain implementations, the first and/or second central conductors 51, 52 can be adjusting to enhance probing. For example, the second central conductor 52 can be adjusted to probe an electric field, such as a vertical electric field, emanating from a surface of the planar antenna element 31. Adjustment can include, for example, changes to a distance between the probe and the patch antenna and/or a change to relative angle between the probe and the patch antenna.

Thus, a test signal can be coupled from the first probe 51 via electrical field to the patch antenna 30, and thereafter from the patch antenna 30 to the second probe 52 on a far edge of the patch antenna. The transmission can be weakly coupled, and a relatively sharp resonance can be measured for center frequency, quality factor, and/or bandwidth, and can be tracked versus temperature.

Figure 4A:
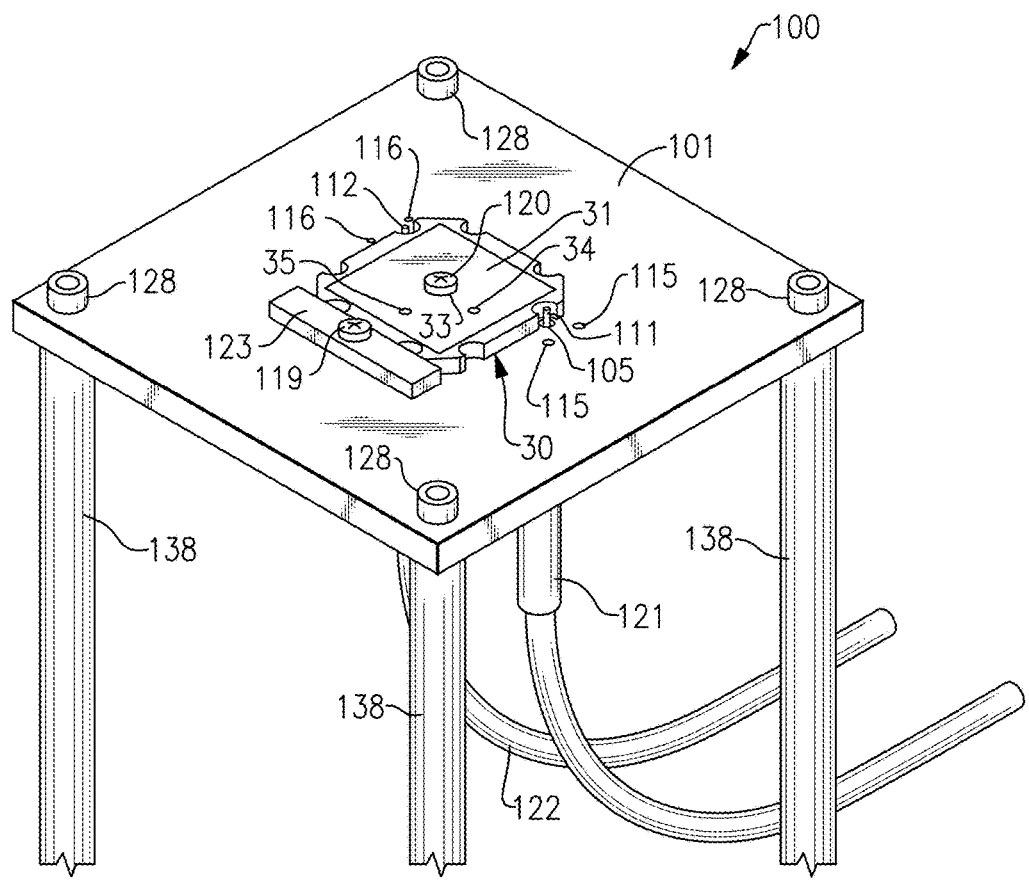
FIG. 4A is a schematic diagram of one embodiment of an electronic testing system for a patch antenna.

FIG. 4A is a schematic diagram of one embodiment of an electronic testing system 100 for a patch antenna 30. The electronic testing system 100 includes a conductive test fixture 101, a first non-conductive fastener 119, a second non-conductive fastener 120, a first probe 121, a second probe 122, a mechanical stop 123, leg fasteners 128, and legs 138.

Figure 4B:
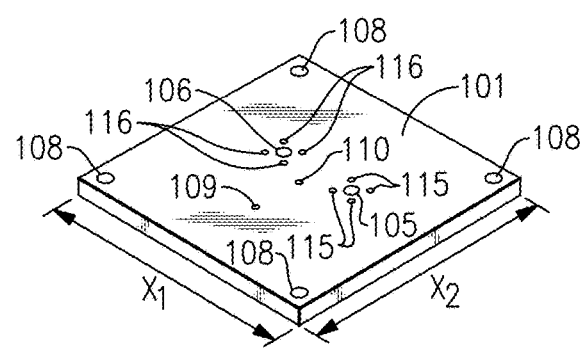
FIG. 4B is a schematic diagram of the test fixture of the electronic testing system of FIG. 4A.

FIG. 4B is a schematic diagram of the test fixture 101 of the electronic testing system 100 of FIG. 4A. The test fixture 101 includes a first probe opening 105, a second probe opening 106, first probe securing holes 115, second probe securing holes 116, leg securing holes 108, a first fastener hole 109, and a second fastener hole 110.

Although one embodiment of an electronic testing system and test fixture is shown in FIGS. 4A-4B, the teachings herein are applicable to electronic testing systems and test fixtures implemented in other ways.

With reference to FIGS. 4A-4B, the test fixture 101 is implemented to receive a patch antenna, such as the illustrated patch antenna 30 shown in FIG. 4A. The first non-conductive fastener 119 passes through the mechanical stop 123 and into the first fastener hole 109, thereby securing the mechanical stop 123 to the test fixture 101. The mechanical stop 123 aids in maintaining the patch antenna 30 relatively steady during testing.

The illustrated embodiment further includes a second non-conductive fastener 120, which passes through the patch antenna 30 and into the second fastener hole 110, thereby further securing the patch antenna 30 to the test fixture 101. However, other configurations are possible, such as implementations in which fasteners do not pass through a patch antenna, such as implementations providing rapid automated testing via automated handlers.

In one embodiment, the first and second non-conductive fasteners 119, 120 are implemented using plastic, such as plastic screws. In certain implementations, the mechanical stop 123 is implemented using plastic and/or another non-conductive material. The first and second non-conductive fasteners 119, 120 aid in providing consistent alignment of the patch antenna 30 to the test fixture 101 and to the probes 121, 122.

However, other implementations of attaching a patch antenna to a test fixture are possible. For example, in another embodiment, a patch antenna is temporarily attached to a test fixture using an adhesive.

As shown in FIGS. 4A-4B, in the illustrated embodiment the leg fasteners 128 pass through the leg securing holes 108 of the test fixture 101, thereby securing the legs 138 to the test fixture 101.

The first probe opening 105 of the test fixture 101 provides passage for a first central conductor 111 of the first probe 121. Additionally, the second probe opening 106 of the test fixture 101 provides passage for a second central conductor 112 of the second probe 122. The first probe opening 105 is orientated such that the first central conductor 111 is spaced apart from and substantially perpendicular to the planar antenna element 31, and the second probe opening 106 is orientated such that the second central conductor 112 is spaced apart from and substantially perpendicular to the planar antenna element 31.

The first probe securing holes 115 are used to secure the first probe 121 to the test fixture 101, and the second probe securing holes 116 are used to secure the second probe 122 to the test fixture 101. For example, the first probe 121 can include fasteners (such as screws) that secure the first probe 121 to the test fixture 101 via the first probe securing holes 115. Similarly, the second probe 122 can includes fasteners (such as screws) that secure the second probe 122 to the text fixture 101 via the second probe securing holes 116.

The test fixture 101 is conductive, and is electrically connected to the backside conductor or ground plane 39 of the patch antenna 30. In one embodiment, the test fixture 101 is implemented as an aluminum plate.

During testing of the patch antenna 30, a test signal is coupled from the first central conductor 111 of the first probe 121 to the planar antenna element 31, and thereafter from the planar antenna element 31 to the second central conductor 112 of the second probe 122.

In the illustrated embodiment, the test fixture 101 has a length x1 and a width x2. The length x1 and the width x2 can be selected such that the test fixture 101 is longer and wider than a patch antenna under test. In one embodiment x1 and x2 are each selected to be in the range of about 3" to about 5", for instance, about 4".

Although the electronic testing system 100 illustrates one embodiment of a patch antenna testing system, the teachings herein are applicable to electronic testing systems implemented in a wide variety of ways. Accordingly, the teachings herein are applicable to other implementations of electronic testing systems.

Figure 5:
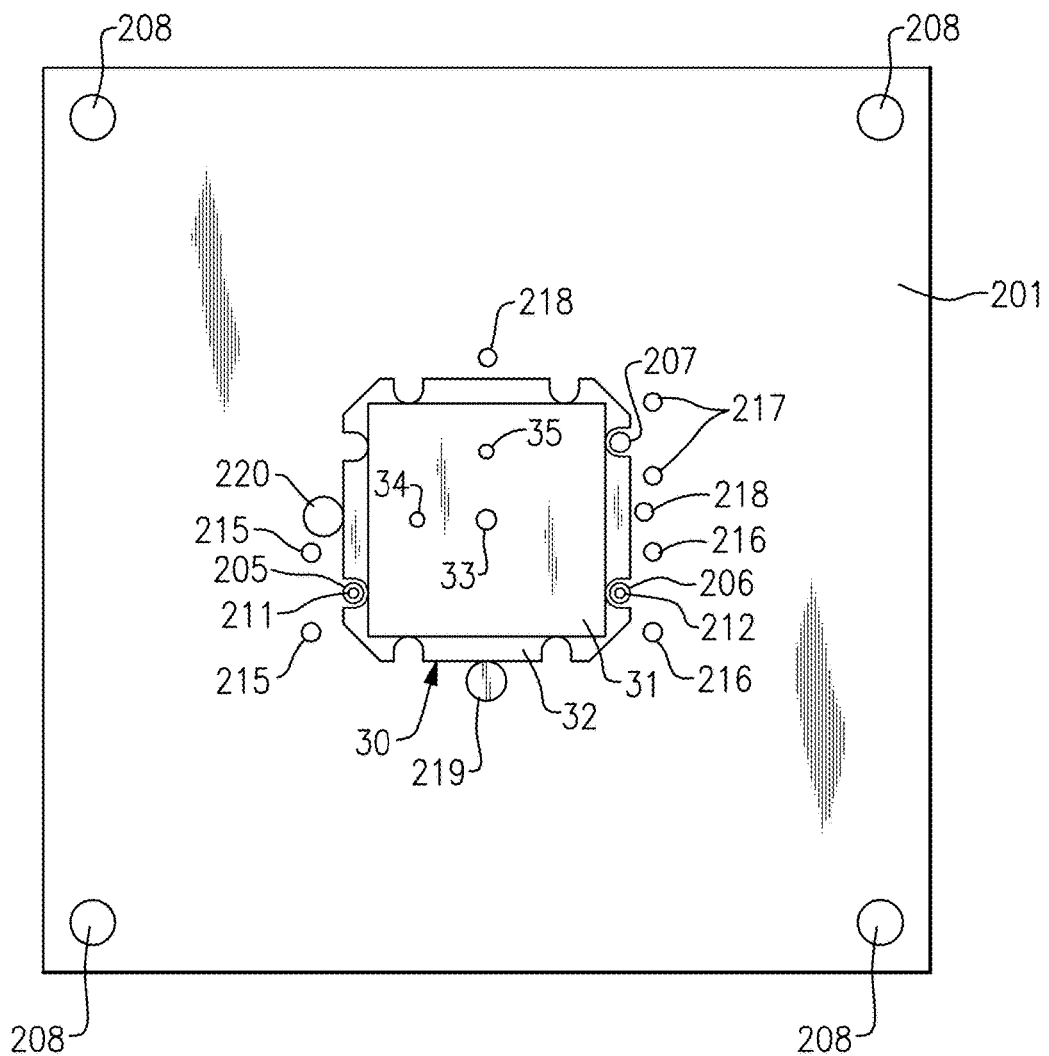
FIG. 5 is a schematic diagram of another embodiment of a test fixture of an electronic testing system for a patch antenna.

FIG. 5 is a schematic diagram of another embodiment of a test fixture 201 of an electronic testing system for a patch antenna. The test fixture 201 is illustrated as testing a patch antenna 30 using a first central conductor 211 of a first probe (for instance, the first probe 121 of FIG. 4A) and a second central conductor 212 of a second probe (for instance, the second probe 122 of FIG. 4A). The patch antenna 30 is secured in this embodiment using a first non-conductive fastener 219 and a second conductive fastener 220.

The test fixture 201 includes a first probe opening 205 for passage of the first central conductor 211, a second probe opening 206 for passage of the second central conductor 212, a third probe opening 207, first probe securing holes 215, second probe securing holes 216, third probe securing holes 217, leg securing holes 208, a first fastener hole for passage of the first non-conductive fastener 219, and a second fastener hole for passage of the second non-conductive fastener 202. The test fixture 201 further includes additional fastener holes 218 for additional non-conductive fasteners.

The test fixture 201 of FIG. 5 is similar to the test fixture 101 shown in FIGS. 4A-4B, except that the test fixture 201 uses a different implementation of securing a patch antenna. Additionally, the test fixture 201 can accommodate probes in different positions and/or more than two probes, thereby providing enhanced flexibility and/or expanded testing capability.

Additional details of the test fixture 201 can be as described earlier.

Figure 6:
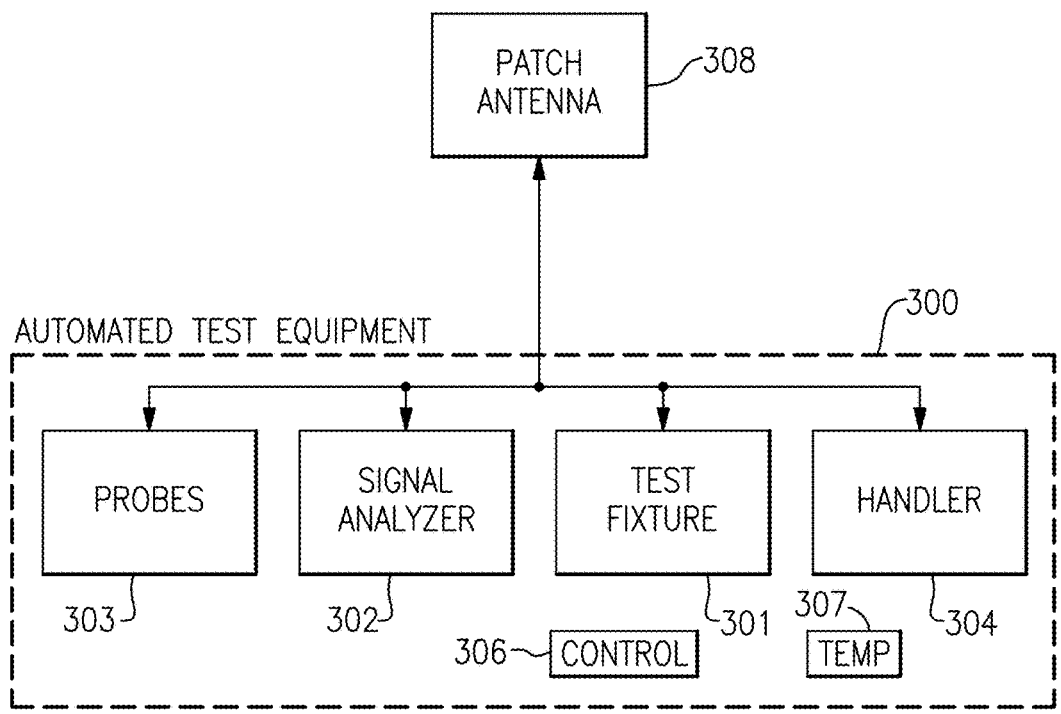
FIG. 6 is a schematic diagram of an automated electronic testing (ATE) system according to one embodiment.

FIG. 6 is a schematic diagram of an automated electronic testing (ATE) system 300 according to one embodiment. An ATE system is also referred to herein as automated test equipment.

The ATE system 300 includes a test fixture 301, a signal analyzer 302, probes 303, a handler 304, a control unit or controller 306, and a temperature unit or controller 307. The ATE system 300 is used to rapidly test patch antennas, such as the patch antenna 308.

The ATE system 300 improves manufacturing throughput by testing patch antennas relatively quickly after manufacturing. The ATE system 300 can be used to test the electrical performance of a patch antenna to ensure that the patch antenna operates within predefined performance specifications and parameters. The ATE system 300 uses automation to quickly perform measurements on patch antennas (such as the patch antenna 308) and to evaluate the test results. The ATE system 300 can be used to reduce a number of defective antennas reaching end-users and/or customers.

The test fixture 301 can include a conductive plate, which serves as a ground plane and electrical connects to a backside conductor of the patch antenna 308. In certain implementations, the test fixture 301 is implemented using the embodiment of FIG. 4B, the embodiment of FIG. 5, or a modification thereof. However, other implementations of test fixtures can be used.

The signal analyzer 302 can be used to generate and analyze electronic signals for testing the patch antenna 308. For example, the signal analyzer 302 can be used to generate radio frequency (RF) signals, including modulated and unmodulated signals suitable for measuring a wide variety of RF and microwave measurements.

In certain implementations, the electronic signals can have, for example, well-controlled frequency, phase, amplitude, bandwidth, power, skew, noise, spurious content, width, rise time, and/or fall time, thereby helping to provide signals suitable for robust electrical testing of the patch antenna 308.

The signal analyzer 302 can also be used to detect the response of the patch antenna 308 to the generated test signal. For example, the signal analyzer 302 can determine an amount of coupling of a test signal from a first one of the probes 303 to a second one of the probes 303 via the patch antenna 308.

The handler 304 can be used to physically move or position the patch antenna 308, including, for example, moving the patch antenna 308, onto or off of the test fixture 301.

In certain implementations, the handler 304 can include a mechanical arm to help move the patch antenna 308 and a plunger for holding the patch antenna 308 to the handler 304 using vacuum suction. However, other implementations of the handler 304 can be used, including, for example, implementations in which handler 304 secures the patch antenna 308 in other ways.

The probes 303 can include at least a first probe and a second probe. Additionally, a test signal can be coupled from the first probe to the patch antenna, and thereafter from the patch antenna to the second probe. In one embodiment, the probes 303 include passive probes, such as transmission line probes.

The temperature unit 307 can be used to control and/or monitor temperature of a patch antenna 308 under test. For example, the ATE system 300 can be used to measure a resonance of the patch antenna 300 for center frequency, quality factor, and/or bandwidth, and the temperature unit 307 allows the measurements to be tracked versus temperature. In certain implementations, the ATE system 300 uses the temperature unit 307 in part to determine a temperature coefficient of the patch antenna 300, such as by performing electrical measurements at two or more different temperatures.

The controller 306 can used to synchronize and/or to provide various control functionalities associated with the components of the ATE system 300, such as the test fixture 301, the signal analyzer 302, the probes 303, the handler 304, and/or the temperature unit 307. In certain implementations, the controller 306 includes a computer or processor configured to operate using instructions stored on a non-transitory computer-readable medium.

Although the ATE system 300 has been illustrated and described as including certain components for clarity, the ATE system 300 can be modified or adapted in other ways. For example, the ATE system 300 can further include additional components, such as power supplies, sensors, digital signal processing instruments, and/or cables and interconnect.

Figure 7:
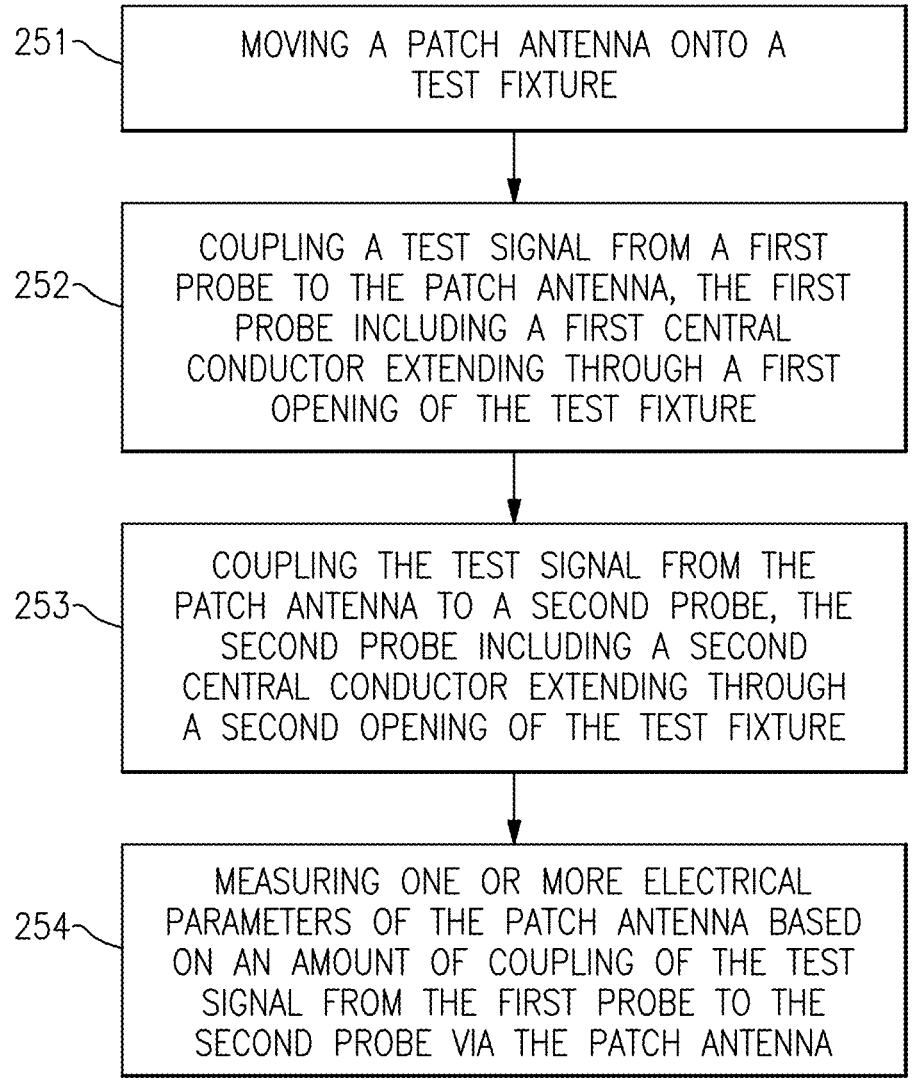
FIG. 7 is a flow chart of a method of testing a patch antenna in accordance with one embodiment.

FIG. 7 is a flow chart of a method 250 of testing a patch antenna in accordance with one embodiment. It will be understood that the method 250 may include greater or fewer operations and the operations may be performed in any order, as necessary. The illustrated method 250 can be used to test patch antennas, including, but not limited to, the patch antenna 30 illustrated in FIGS. 1A-1B.

The method 250 starts at block 251, in which a patch antenna is moved or positioned onto a test fixture. In certain implementations, an automated handler (for example, the handler 304 of FIG. 6) is used to move the patch antenna onto the test fixture.

In an ensuing block 252, a test signal is coupled from a first probe to the patch antenna. The first probe includes a first central conductor that extends through a first opening of the test fixture. In certain configurations, the test fixture 301 is implemented using the embodiment of FIG. 4B, the embodiment of FIG. 5, or a modification thereof. However, other implementations of test fixtures can be used.

The method 250 continues at a block 253, in which the test signal is coupled from the patch antenna to a second probe. The second probe includes a second central conductor extending through a second opening of the test fixture.

In an ensuing block 254, one or more electrical parameters of the patch antenna are measured based on an amount of coupling of the test signal from the first probe to the second probe via the patch antenna.

Although the method 250 is illustrated as ending at block 254, the method 250 can be iteratively repeated to test multiple patch antennas. For example, the patch antenna can be removed from the test fixture, and the method can be restarted at block 251 for the next patch antenna.

Figure 8:
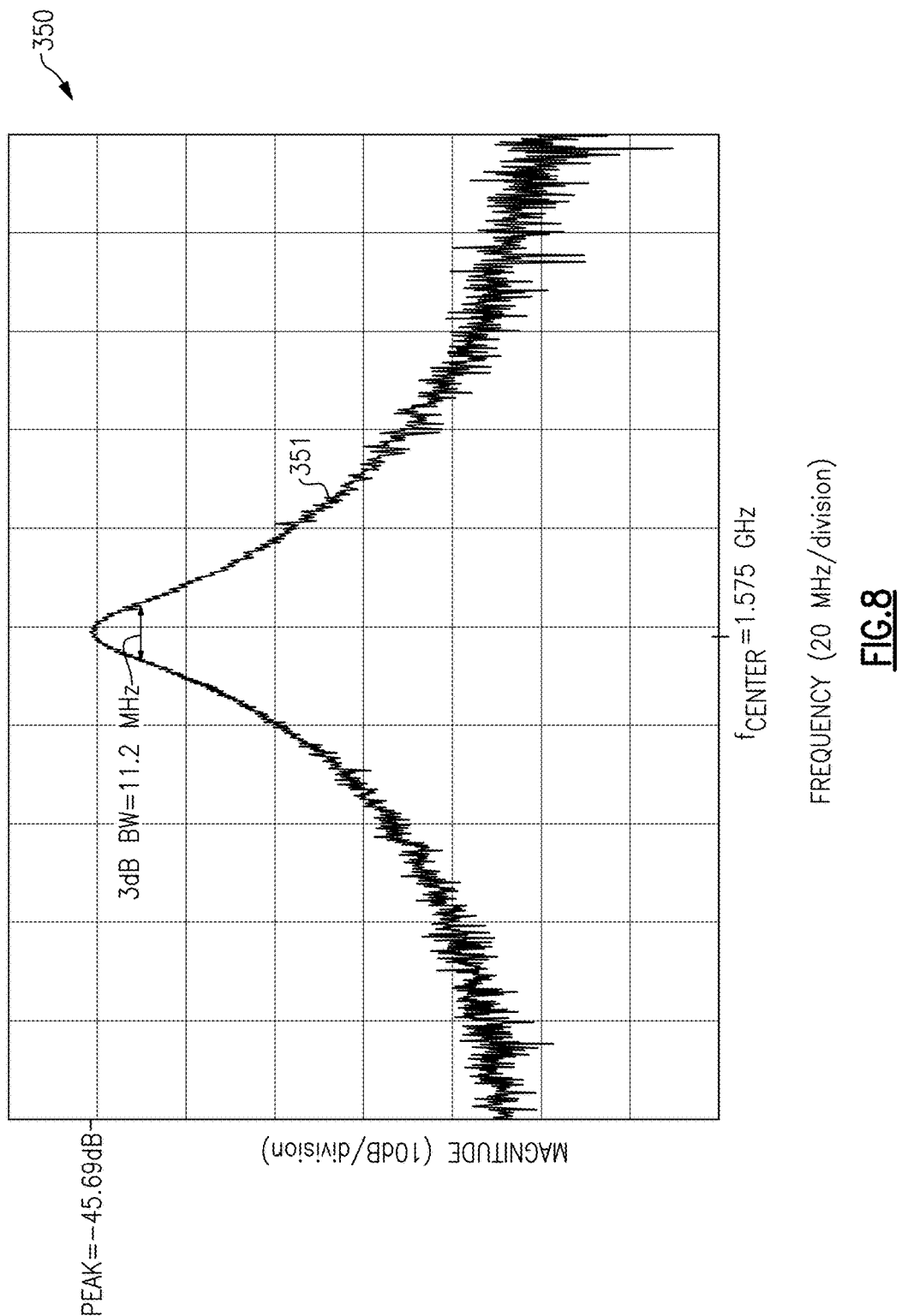
FIG. 8 is a graph of one example of patch antenna test measurements.

FIG. 8 is a graph 350 of one example of patch antenna test measurements. The graph 350 includes a plot 351 of gain versus frequency. The frequency axis corresponds to 20

MHz per division, and the magnitude axis corresponds to 10 dB per division. A center frequency of about 1.575 GHz with a peak magnitude of about −45.69 dB was observed. Additionally, a 3 dB bandwidth of 11.2 MHz was observed, with a corresponding quality factor of about 140.

The graph 350 corresponds to lab data for one implementation of a patch antenna using the implementation shown in FIGS. 1A-1B, where the patch antenna is 1.5″ square, with a copper ground plane and planar antenna element, and a plastic dielectric substrate. The patch antenna was tested using one implementation of the test fixture 201 of FIG. 5.

As shown in FIG. 8, the patch antenna exhibits a relatively sharp resonance. Thus, a patch antenna can be measured for center frequency, quality factor, and/or bandwidth, and the measurements can be tracked versus temperature.

Although one example of measurement results of a patch antenna are shown, electrical performance of a patch antenna can vary with a wide range of factors, including, but not limited to, design implementation, operating environment, and/or manufacturing.

In certain embodiments herein, a patch antenna is tested, and the test measurements or results are used for making adjustments to the manufacturing process of the patch antenna.

For example, the patch antenna 30 of FIGS. 1A-1B or other suitable patch antenna can be manufactured using an antenna pattern corresponding to the shape of the planar antenna element 31 and a batch of dielectric for making the dielectric substrate 32. Additionally multiple patch antennas can be made from a given batch of dielectric, such as one hundred or more patch antennas for a given batch.

Absent compensation, variation from batch to batch of dielectric can result in patch antennas made using different batches having different performance characteristics. For example, a patch antenna made from a first batch of dielectric can have a different resonance, center frequency, quality factor, and/or bandwidth relative to a patch antenna made form a second batch of dielectric.

The testing methods herein can be used to generate measurements suitable for adjusting a patch antenna manufacturing process.

Figure 9:
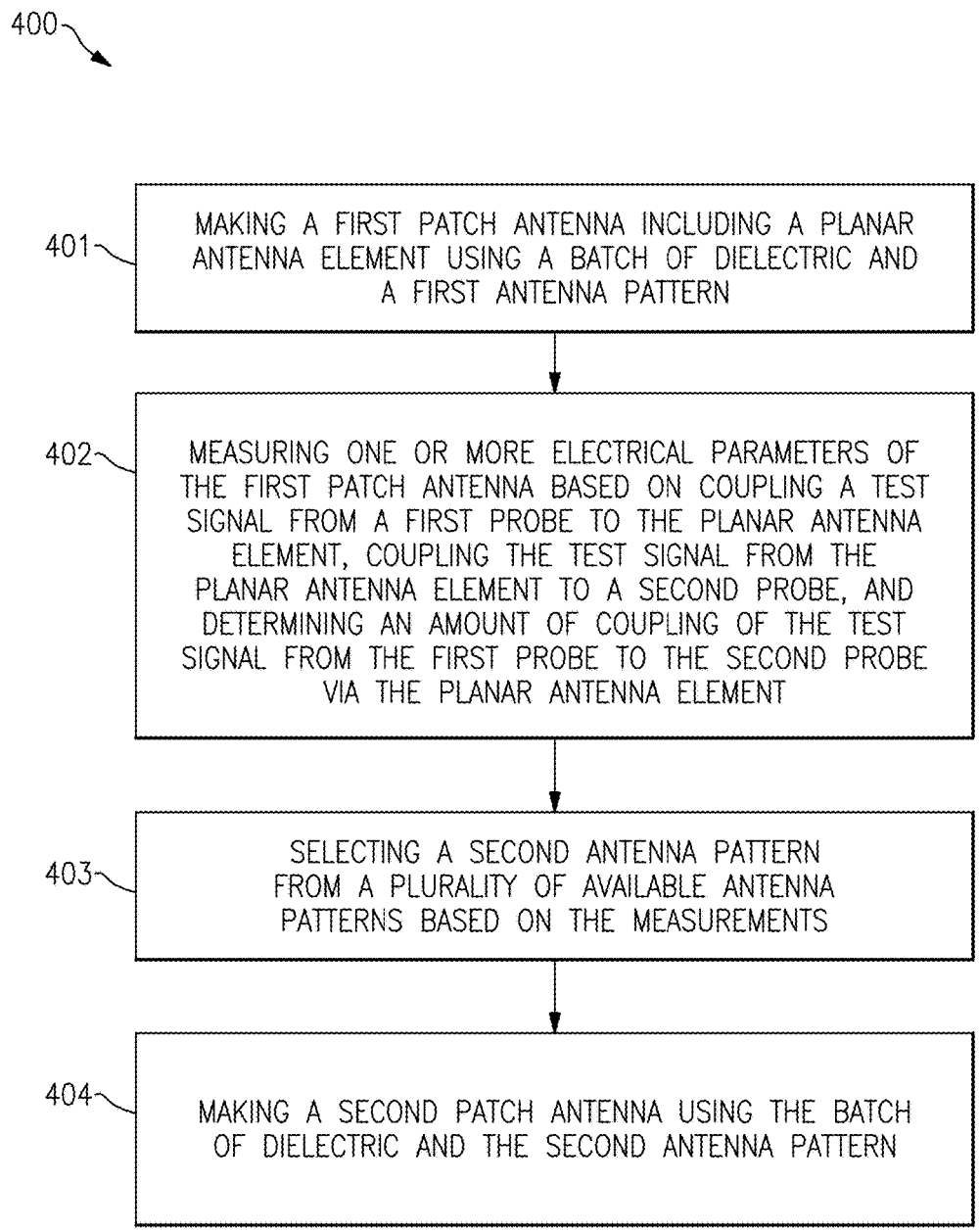
FIG. 9 is a flow chart of a method of making patch antennas in accordance with one embodiment.

FIG. 9 is a flow chart of a method 400 of making patch antennas in accordance with one embodiment. It will be understood that the method 400 may include greater or fewer operations and the operations may be performed in any order, as necessary. The illustrated method 400 can be used to test patch antennas, including, but not limited to, the patch antenna 30 illustrated in FIG. 1.

The method 400 starts at block 401, in which a first patch antenna including a planar antenna element is made using a batch of dielectric and a first antenna pattern.

In certain implementations, the batch of dielectric corresponds to a batch of ceramic powder. Additionally, the batch of ceramic is processed in a mold to form a dielectric substrate of the patch antenna. However, other implementations are possible.

The planar antenna element of the first patch antenna has a shape based on the first antenna pattern. In certain implementations, the first antenna pattern is implemented on a first screen, and the planar antenna element is formed by screen printing of the first antenna pattern. For example, a metallic film (for instance, thick film silver) can be forced through the screen onto a substrate, and heated to form the planar antenna element.

In an ensuing block 402, one or more electrical parameters of the first patch antenna is measured based on coupling a test signal from a first probe to the planar antenna element, coupling the test signal from the planar antenna element to a second probe, and determining an amount of coupling of the test signal from the first probe to the second probe via the planar antenna element.

The electrical parameters can include, but are not limited to, resonance, center frequency, quality factor, and/or bandwidth of the first patch antenna.

In certain configurations, the measurements are made using a test fixture, such as the embodiment of FIG. 4B, the embodiment of FIG. 5, or a modification thereof. However, other implementations of test fixtures can be used.

The method 400 continues at a block 403, in which a second antenna pattern is selected from a plurality of available antenna patterns based on the measurements. The available antenna patterns can provide, for example, different shapes of planar antenna elements (for instance, different widths and/or lengths) associated with different nominal antenna characteristics.

When a particular electrical parameter deviates from a nominal or desired value, an antenna pattern suitable for compensating for the deviation is selected. Thus, subsequent patch antennas manufactured using the batch of dielectric and the new antenna pattern can have electrical parameters closer to the desired values of the electrical parameters.

Adjusting the patch antenna manufacturing process in this manner can avoid a need for mechanical tuning after manufacture. For instance, although a patch antenna can be abraded after manufacture to compensate for variation in electrical parameters, abrasion and other mechanical tuning can be expensive, time consuming, and/or impractical.

In an ensuing block 404, a second patch antenna is made using the batch of dielectric and the second antenna pattern.

In certain embodiments, the second patch antenna is tested in a manner similar to block 402. The results of the measurements can be used to confirm the electrical parameters of the second patch antenna are at or near desired values and/or used to select a third antenna pattern from the available antenna patterns to thereby provide further compensation.

Once a desired antenna pattern suitable for the batch of dielectric has been identified, hundreds or thousands of patch antennas can be manufactured using the antenna pattern and the batch of dielectric.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of electronic testing of patch antennas, the method comprising:
   moving a patch antenna having a planar antenna element onto a test fixture using an automated handler, including positioning the patch antenna onto a portion of the test fixture between a first probe and a second probe;
   coupling a test signal from the first probe to the planar antenna element without physically contacting the planar antenna element with the first probe;
   coupling the test signal from the planar antenna element to the second probe without physically contacting the planar antenna element with the second probe; and
   measuring a center frequency of the patch antenna based on an amount of coupling of the test signal from the first probe to the second probe by way of the planar antenna element.

2. The method of claim 1 wherein measuring the center frequency includes controlling a frequency of the test signal to a plurality of frequency values to measure a frequency response characteristic of the patch antenna.

3. The method of claim 2 further comprising measuring a quality factor of the patch antenna based on the amount of coupling.

4. The method of claim 2 further comprising measuring a bandwidth of the patch antenna based on the amount of coupling.

5. The method of claim 1 further comprising controlling a temperature for measuring the center frequency using a temperature unit.

6. The method of claim 5 further comprising measuring the center frequency at a first temperature level, changing the temperature from the first temperature level to a second temperature level using the temperature unit, and measuring the center frequency at the second temperature level.

7. The method of claim 1 wherein coupling the test signal from the planar antenna element to the second probe includes sensing a vertical electric field emanating from an edge of the planar antenna element.

8. The method of claim 1 wherein coupling the test signal from the first probe to the planar antenna element includes generating an electric field using a transmission line probe.

9. An electronic testing system for testing patch antennas, the electronic testing system comprising:
   a test fixture including a first opening and a second opening;
   an automated handler configured to move a patch antenna having a planar antenna element onto and off of a portion of the test fixture between the first opening and the second opening;
   a first probe configured to extend through the first opening without physically contacting the planar antenna element when the patch antenna is on the test fixture;
   a second probe configured to extend through the second opening without physically contacting the planar antenna element when the patch antenna is on the test fixture; and
   a signal analyzer configured to generate a test signal on the first probe, and to measure a center frequency of the patch antenna by determining an amount of coupling of the test signal from the first probe to the second probe by way of the planar antenna element.

10. The electronic testing system of claim 9 wherein the signal analyzer is configured to control a frequency of the test signal to a plurality of frequency values to measure a frequency response characteristic of the patch antenna.

11. The electronic testing system of claim 10 wherein the signal analyzer is further configured to measure a quality factor of the patch antenna.

12. The electronic testing system of claim 10 wherein the signal analyzer is further configured to measure a bandwidth of the patch antenna.

13. The electronic testing system of claim 9 further comprising a controller for synchronizing the operation of the signal analyzer and the automated handler.

14. The electronic testing system of claim 9 further comprising a temperature unit configured to control a temperature for measuring the center frequency.

15. The electronic testing system of claim 9 wherein the test fixture includes a conductive plate configured to electrically connect to a backside conductor of the patch antenna.

16. The electronic testing system of claim 9 wherein the first probe is a first transmission line probe and the second probe is a second transmission line probe.

17. A method of manufacturing patch antennas, the method comprising:

making a first patch antenna including a planar antenna element using a batch of dielectric and a first antenna pattern;

measuring a center frequency of the first patch antenna based on coupling a test signal from a first probe to the planar antenna element without physically contacting the planar antenna element with the first probe, coupling the test signal from the planar antenna element to a second probe without physically contacting the planar antenna element with the second probe, and determining an amount of coupling of the test signal from the first probe to the second probe by way of the planar antenna element;

selecting a second antenna pattern from a plurality of available antenna patterns based on the measured center frequency; and making a second patch antenna using the batch of dielectric and the second antenna pattern.

18. The method of claim 17 wherein measuring the center frequency includes controlling a frequency of the test signal to a plurality of frequency values to measure a frequency response characteristic of the first patch antenna.

19. The method of claim 17 wherein the plurality of available antenna patterns each have a different corresponding shape of the planar antenna element.

20. The method of claim 17 further comprising measuring a center frequency of the second patch antenna, selecting a third antenna pattern from the plurality of available antenna patterns based on the measured center frequency of the second patch antenna, and making a third patch antenna using the batch of dielectric and the third antenna pattern.

* * * * *